(12) United States Patent
Cheng et al.

(10) Patent No.: US 10,164,103 B2
(45) Date of Patent: Dec. 25, 2018

(54) FORMING STRAINED CHANNEL WITH GERMANIUM CONDENSATION

(71) Applicant: INTERNATIONAL BUSINESS MACHINES CORPORATION, Armonk, NY (US)

(72) Inventors: Kangguo Cheng, Schenectady, NY (US); Shogo Mochizuki, Schenectady, NY (US); Jie Yang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 71 days.

(21) Appl. No.: 15/294,986

(22) Filed: Oct. 17, 2016

(65) Prior Publication Data

US 2018/0108769 A1    Apr. 19, 2018

(51) Int. Cl.
*H01L 29/66* (2006.01)
*H01L 29/78* (2006.01)
(Continued)

(52) U.S. Cl.
CPC ...... *H01L 29/785* (2013.01); *H01L 21/26513* (2013.01); *H01L 29/0847* (2013.01);
(Continued)

(58) Field of Classification Search
CPC ............ C12Q 2565/537; C12Q 1/6846; C12Q 1/6806; C12Q 1/686; C12Q 2531/119; C12Q 1/6825; C12Q 1/6874; C12Q 1/6827; C12Q 1/6869; C12Q 2537/157; C12Q 2563/107; C12Q 2563/137; C12Q 2565/30
See application file for complete search history.

(56) References Cited

U.S. PATENT DOCUMENTS

| 5,548,128 A | 8/1996 | Soref et al. |
| 7,494,884 B2 | 2/2009 | Lin et al. |

(Continued)

FOREIGN PATENT DOCUMENTS

| CN | 102810555 A | 12/2012 |
| CN | 103270600 A | 8/2013 |
| CN | 103681868 A | 3/2014 |

OTHER PUBLICATIONS

Genquan Han et al., "Strained Germanium-Tin (GeSn) N-channel MOSFETs featuring Low Temperature N+/P Junction Formation and GeSnO2 Interfacial Layer", 2012 Symposium on VLSI Technology Digest of Technical Papers, Dec. 31, 2012, pp. 97-98.

(Continued)

*Primary Examiner* — Robert Bachner
(74) *Attorney, Agent, or Firm* — Cantor Colburn LLP; Vazken Alexanian

(57) ABSTRACT

A method for forming a semiconductor device includes forming a strained fin on a substrate, a sacrificial gate on a channel region of the fin, a first spacer adjacent to a sidewall of the fin, and a second spacer adjacent to the first spacer. A source/drain region is grown on an exposed portion of the fin. Atoms are driven from the source/drain region into the fin and form an oxide layer on the source/drain region. The second spacer and the oxide layer are removed. An insulator layer is formed over the source/drain region, and the sacrificial gate is removed to expose the channel region of the fin. A gate stack is formed over the channel region of the fin.

18 Claims, 28 Drawing Sheets

(51) Int. Cl.
*H01L 29/165* (2006.01)
*H01L 29/08* (2006.01)
*H01L 21/265* (2006.01)

(52) U.S. Cl.
CPC ........ *H01L 29/165* (2013.01); *H01L 29/6656* (2013.01); *H01L 29/66545* (2013.01); *H01L 29/66795* (2013.01); *H01L 29/7848* (2013.01)

(56) References Cited

U.S. PATENT DOCUMENTS

| | | |
|---|---|---|
| 7,998,881 B1 | 8/2011 | Wu et al. |
| 8,293,611 B2 | 10/2012 | Bhattacharyya et al. |
| 8,450,155 B2 | 5/2013 | Huang et al. |
| 8,679,928 B2 | 3/2014 | Bhattacharyya et al. |
| 9,076,867 B2 | 7/2015 | Bhattacharyya et al. |
| 2007/0207598 A1 | 9/2007 | Damlencourt et al. |
| 2012/0097977 A1 | 4/2012 | Yamaguchi |
| 2015/0194525 A1 | 7/2015 | Xu et al. |

OTHER PUBLICATIONS

Yee-Chia Yeo: "Advanced Channel and Contact Technologies for Future CMOS Devices", VLSI Technology, Systems, and Applications (VLSI-TSA), 2012 International Symposium on, Dec. 31, 2012, pp. 1-2.

Cheng et al., "Forming Strained Channel With Germanium Condensation," U.S. Appl. No. 16/106,462, filed Aug. 21, 2018.

List of IBM Patents or Patent Applications Treated As Related; Date Filed: Oct. 17, 2016, 2 pages.

FORMING STRAINED CHANNEL WITH GERMANIUM CONDENSATION

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

SUMMARY

According to an embodiment of the present invention, a method for forming a semiconductor device includes forming a strained fin on a substrate, a sacrificial gate on a channel region of the fin, a first spacer adjacent to a sidewall of the fin, and a second spacer adjacent to the first spacer. A source/drain region is grown on an exposed portion of the fin. Atoms are driven into the fin at source drain region and form an oxide layer on the source/drain region. The second spacer and the oxide layer are removed. An insulator layer is formed over the source/drain region, and the sacrificial gate is removed to expose the channel region of the fin. A gate stack is formed over the channel region of the fin.

According to another embodiment of the present invention, a method for forming a semiconductor device comprises forming a strained semiconductor layer on a substrate, and removing portions of the strained semiconductor layer to form a fin on the substrate. An insulator layer is deposited on the substrate. A sacrificial gate is formed on a channel region of the fin. A first spacer is formed adjacent to a sidewall of the fin, and a second spacer is formed adjacent to the first spacer. A source/drain region is grown on an exposed portion of the fin. Atoms are driven into the fin at source drain region and form an oxide layer on the source/drain region. The second spacer and the oxide layer are removed. An insulator layer is formed over the source/drain region and the sacrificial gate is removed to expose the channel region of the fin. A gate stack is formed over the channel region of the fin.

According to yet another embodiment of the present invention, a semiconductor device includes a strained fin arranged on a substrate and a gate stack arranged over a channel region of the fin. A spacer is arranged adjacent to a sidewall of the gate stack, and a source/drain region is arranged on the fin, the source/drain region spaced a distance from the spacer the source/drain region including a strained region arranged below a crystalline portion of the source/drain region. A doped source/drain extension region is arranged in the fin between the source/drain region and the spacer.

BRIEF DESCRIPTION OF THE DRAWINGS

FIGS. 1-13C illustrate an exemplary method for forming a FET device having a strained channel region.

FIG. 1 illustrates a side view of a wafer that includes a semiconductor layer (substrate) and a sacrificial hardmask arranged on the semiconductor substrate.

FIG. 3 illustrates a cut-away view following the formation of a shallow trench isolation (STI) region adjacent to the fin.

FIG. 13C illustrates a top view of the resultant structure following an etching process that removes portions of the inter-level dielectric layer to form cavities that are filled with a conductive contact material.

DETAILED DESCRIPTION

Figure 1:
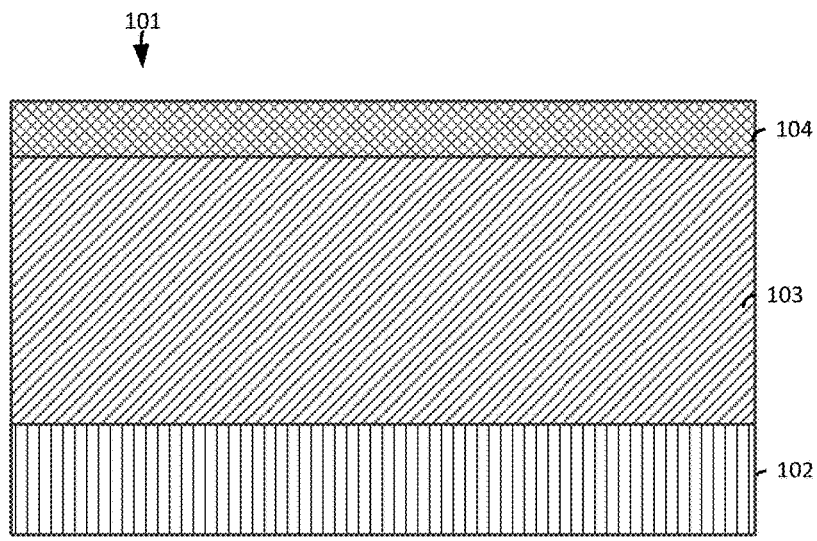

As previously noted herein, the MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

The source/drain regions are often formed with a silicide material that is formed on a doped semiconductor material. A liner layer is often arranged on the silicide material, and a conductive contact is formed on the liner layer.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

Strain induced in the channel regions of semiconductor devices often improves the performance characteristics of the devices. In many complementary metal oxide semiconductor (CMOS) devices, a tensile strain is desired in the channel region of a n-type field effect transistor (FET) device (nFET) and a compressive strain is desired in the channel region of a p-type FET device (pFET). Strained channel regions often enhance electron mobility or hole mobility, which improves conductivity through the channel regions of FET devices.

Strain can be induced and modulated by, for example, epitaxially growing crystalline materials on a seed layer where the grown materials have different lattice constants than the seed layer. For example, when silicon is epitaxially grown on a relaxed layer of silicon germanium, a tensile strain is induced in the grown silicon material. Conversely, when a layer of silicon germanium is grown on a silicon seed layer, a compressive strain is induced in the grown layer of silicon germanium.

On thick layers of strained epitaxially grown materials, the strain on the materials is often not constant throughout the material. The region of the grown material that contacts the seed layer (lower region) is strained, but as the thickness of the grown material increases during the growth process, the strain relaxes in the regions that are spaced further from the seed layer (the upper regions). Thus, it is often challenging to modulate the strain on thick layers of epitaxially grown materials. Thick epitaxially grown materials are often more prone to having defects that can be induced during the growth process. In some devices, defects in the channel materials can be undesirable, and reduce the performance of the devices.

When forming finFET devices, the fins are often etched to form a recess prior to forming the source/drain region in the cavity of the fin. The etching of the fin often undesirably relaxes the strain in the channel region of the fin, which reduces the performance of the device. The methods and resultant structures described herein provide for forming source/drain regions on fins of s finFET device without forming a recess in the fin that would reduce the strain in the channel region of the fin.

Strained channel SiGe p-type finFETs benefit from the uniaxial compressive strain from the Si substrate. The conventional approach to form source/drain is to perform cavity etch first, followed by epitaxy SiGe for pFET, to apply favorably compressive strain on channel. But as the volume available for source drain epitaxy reduces, and in the cases with initially stress channel (for instance, SiGe finFET channel), the recess step will relax the channel and make it difficult to recover from source drain. The methods described herein provide additional compressive strain on the initially stressed channel with Ge condensation, which avoids the strain relaxation in the channel due to the S/D cavity recess step used in previous fabrication methods. The method can provide additional strain on an initially stressed channel (e.g., biaxial strained SiGe channel finFET), and hence, improve the mobility, drive current and other performance parameters.

FIGS. 1-13C illustrate an exemplary method for forming a FET device having a strained channel region.

FIG. 1 illustrates a side view of a wafer 101 that includes a substrate 102, a strained active layer 103 arranged on the substrate 102 and a sacrificial hardmask 104 arranged on the semiconductor substrate 102.

Non-limiting examples of suitable materials for the semiconductor layer 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A hardmask layer 104 is arranged on the strained active layer 103. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

In the illustrated exemplary embodiment the substrate 102 includes a bulk silicon material, and the strained active layer 103 includes a strained SiGe material.

Though the illustrated embodiments show a bulk semiconductor substrate 102, alternative exemplary embodiments can include a semiconductor on insulator wafer arrangement.

Figure 2A:
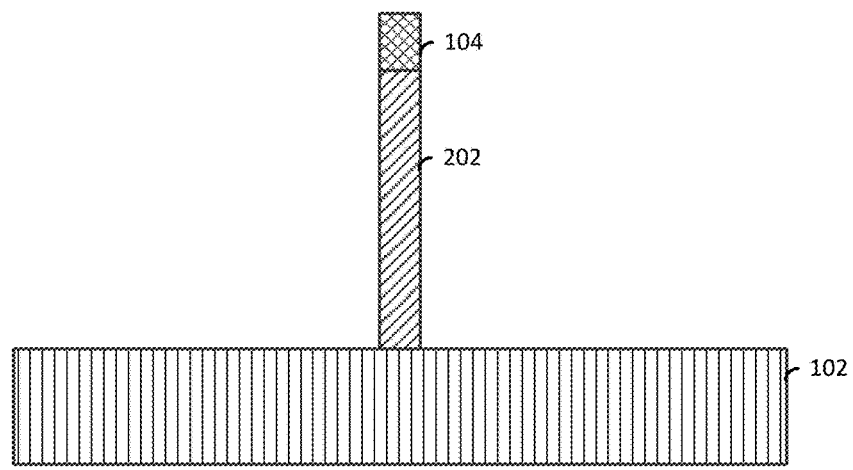
FIG. 2A illustrates a cut-away view along the line A-A (of FIG. 2B) following a lithographic patterning and etching process that forms semiconductor fin.

FIG. 2A illustrates a cut-away view along the line A-A (of FIG. 2B) following a lithographic patterning and etching process that forms semiconductor fin 202. The fin 202 is formed by, for example, a photolithographic patterning and etching process such as reactive ion etching process that patterns a resist on the hardmask 104 and removes exposed portions of the hardmask 104 and the strained active layer 103 to form the fin 202. The fin 202 is strained compressively in the illustrated exemplary embodiment however; alternate exemplary embodiments can include any type of strain.

Figure 2B:
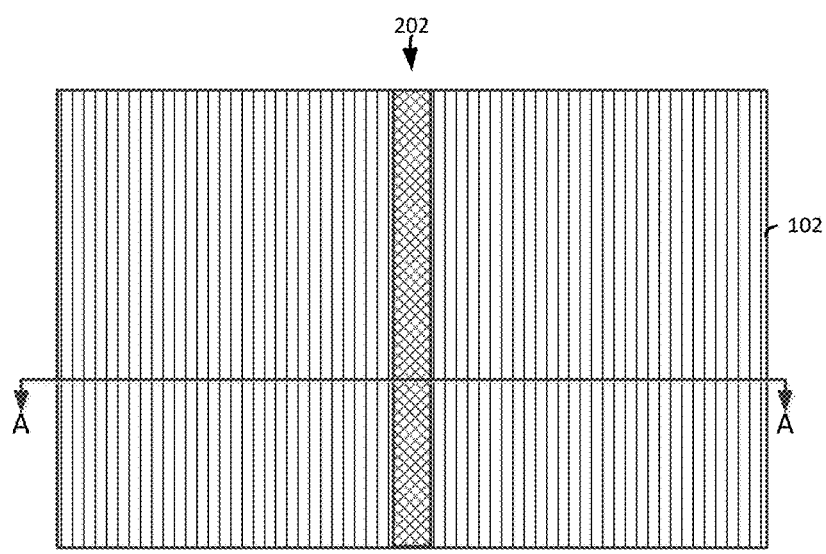
FIG. 2B illustrates a top view of the fin arranged on the substrate.

FIG. 2B illustrates a top view of the fin 202 arranged on the substrate 102.

Figure 3:
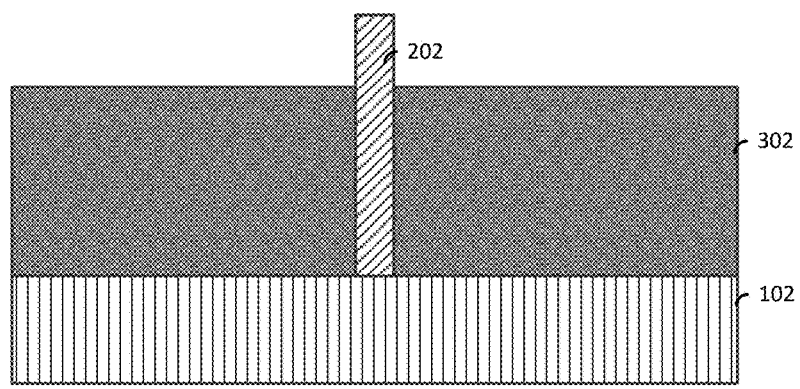

FIG. 3 illustrates a cut-away view following the formation of a shallow trench isolation (STI) region 302 adjacent to the fin 202. The STI region 302 can be formed by, any suitable process including, for example, lithography or etching to form trenches, and then filling the trenches with an insulating material, such as silicon dioxide.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 4A:
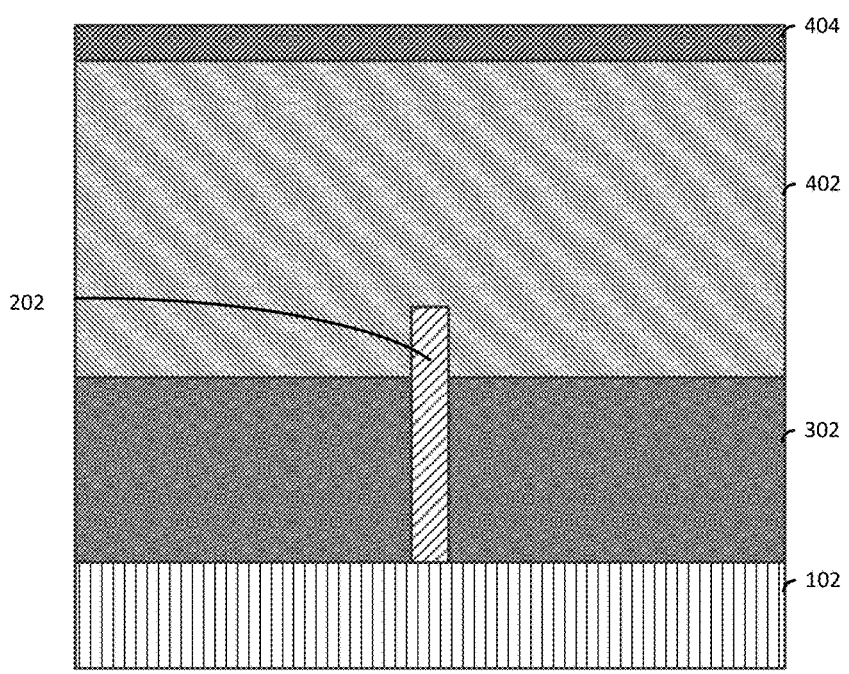
FIG. 4A illustrates a cut-away view along the line A-A (of FIG. 4B) following the formation of sacrificial gates over channel regions of the fin and spacers.

FIG. 4A illustrates a cut-away view along the line B-B (of FIG. 4B) following the formation of sacrificial gates 402 over channel regions of the fin 202 and spacers 406.

The sacrificial gates 402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 402 can further include a sacrificial gate dielectric material such as silicon oxide between the nanowires and aSi or polysilicon material.

The layer sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 402 and the sacrificial gate cap 404.

Spacers 406 are formed adjacent to the sacrificial gates 402. The spacers 406 in the illustrated embodiment are formed by depositing a layer of spacer material (not shown) over the exposed portions of the fin 202 and the sacrificial gates 402.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 4B:
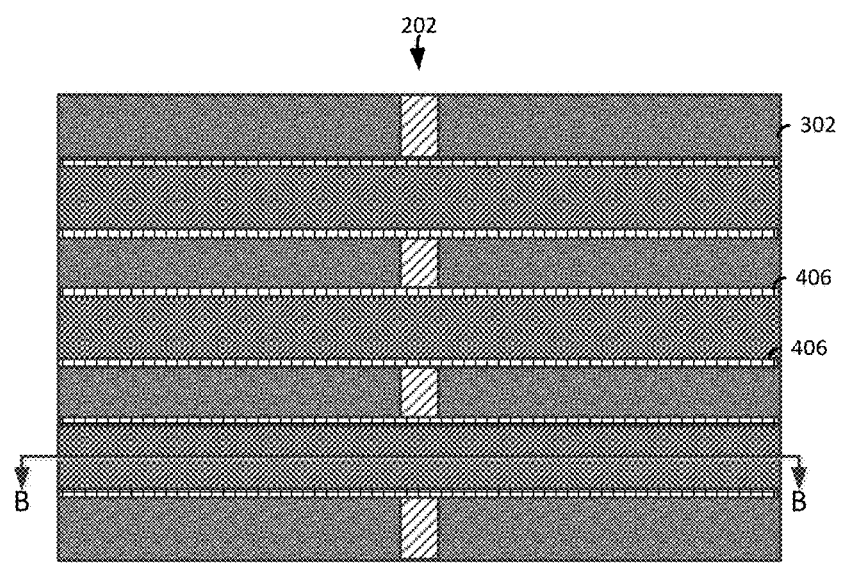
FIG. 4B illustrates a top view of the sacrificial gate and spacers.

Following the deposition of the layer of spacer material, a suitable anisotropic etching process such as, for example, a reactive ion etching process is performed to remove portions of the layer of spacer material and form the spacers 406. FIG. 4B illustrates a top view of the sacrificial gate 402 and spacers 406.

Figure 5A:
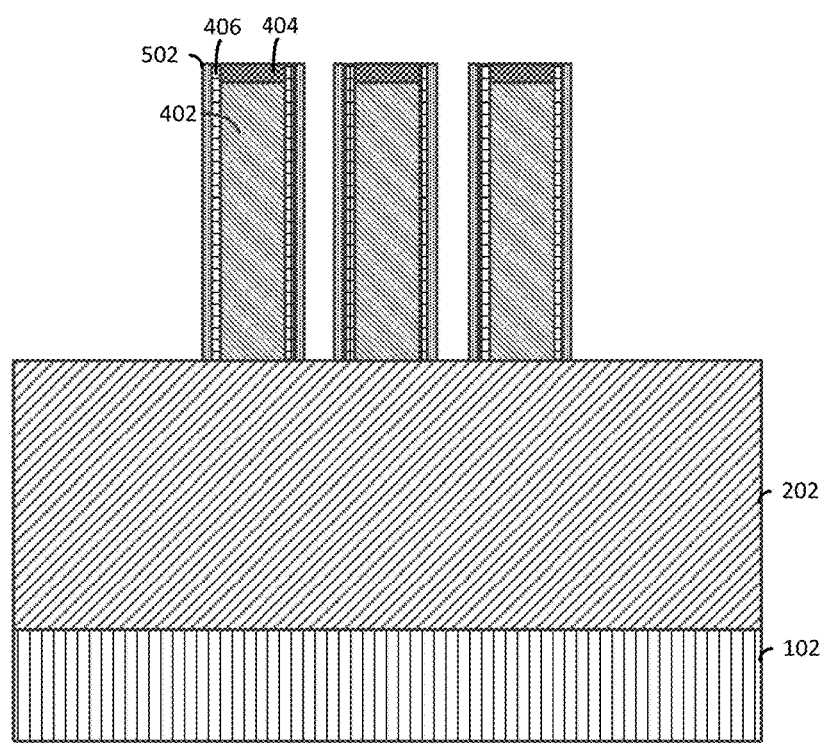
FIG. 5A illustrates a cut-away view along the line C-C (of FIG. 5B) following the formation of a sacrificial spacer adjacent to the spacers.

FIG. 5A illustrates a cut-away view along the line C-C (of FIG. 5B) following the formation of a sacrificial spacer 502 adjacent to the spacers 406. The sacrificial spacer 502 can be formed from, for example, an oxide material that is dissimilar from the material used to form the spacers 406.

Figure 5B:
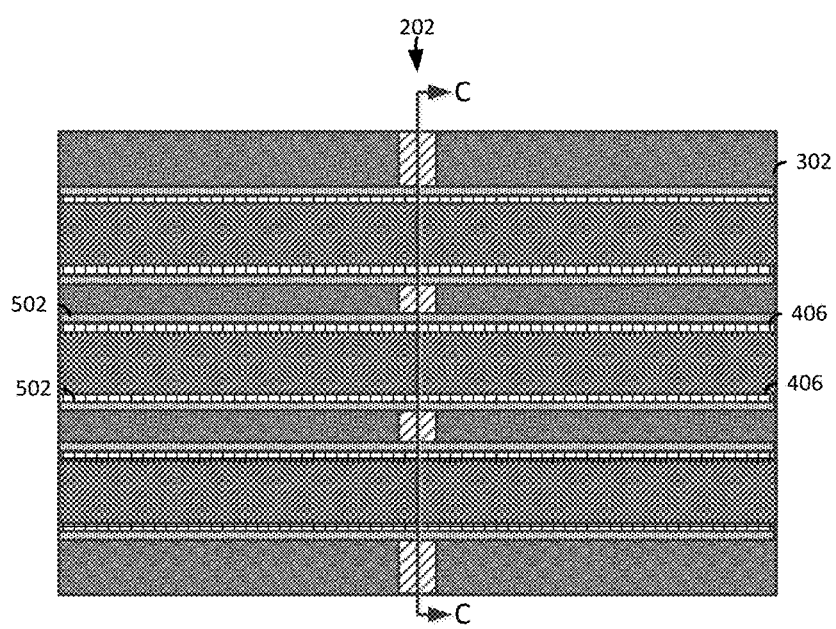
FIG. 5B illustrates a top view following the formation of the sacrificial spacers.

FIG. 5B illustrates a top view following the formation of the sacrificial spacers 502.

Figure 6A:
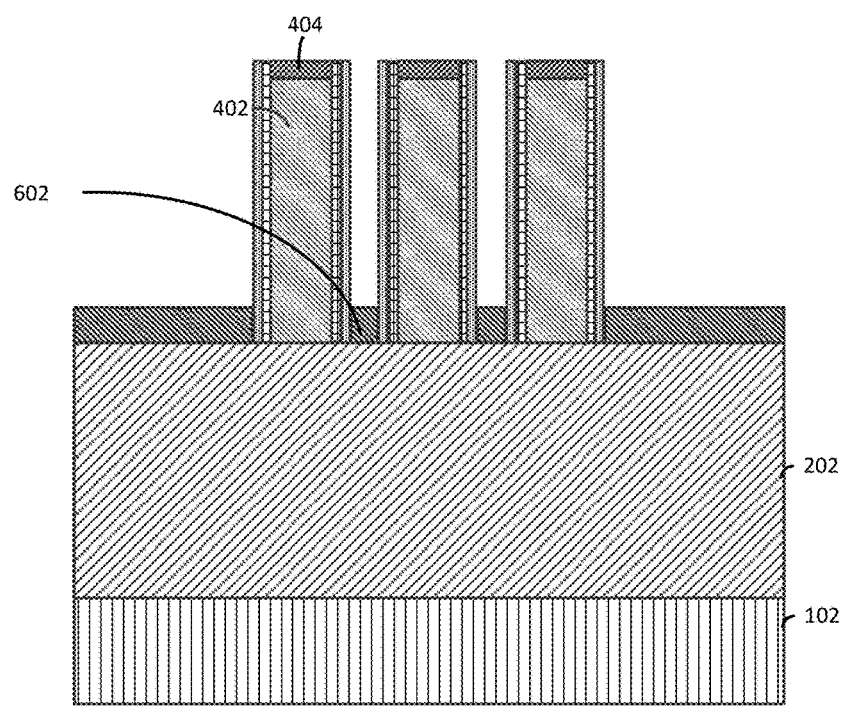
FIG. 6A illustrates a cut-away view along the line C-C (of FIG. 6C) following the formation of source/drain regions on exposed portions of the fin.
Figure 6B:
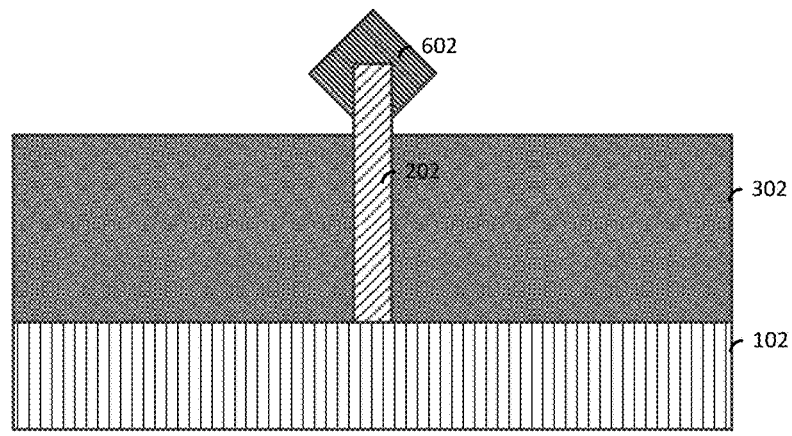
FIG. 6B illustrates a cut-away view along the line A-A (of FIG. 6C) following the formation of source/drain regions on exposed portions of the fin.
Figure 6C:
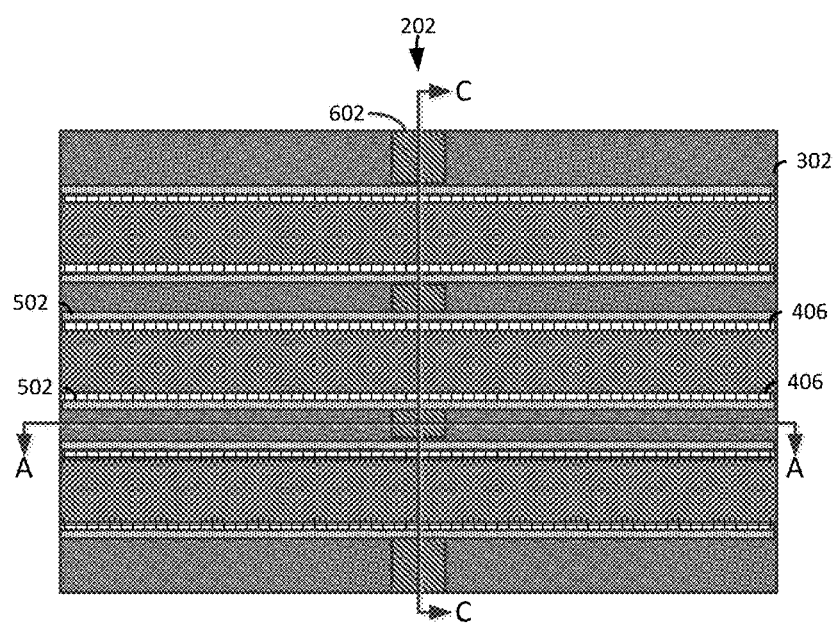
FIG. 6C illustrates a top view following the formation of the source/drain regions.

FIG. 6A illustrates a cut-away view along the line C-C (of FIG. 6C) following the formation of source/drain regions 602 on exposed portions of the fin 202. FIG. 6B illustrates a cut-away view along the line A-A (of FIG. 6C) following the formation of the source/drain regions 602. FIG. 6C illustrates a top view following the formation of the source/drain regions 602.

The source/drain regions 602 are formed by an epitaxial growth process that deposits a crystalline overlayer of semiconductor material onto the exposed crystalline seed material of the exposed fin 202 to form the source/drain regions 602.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 7A:
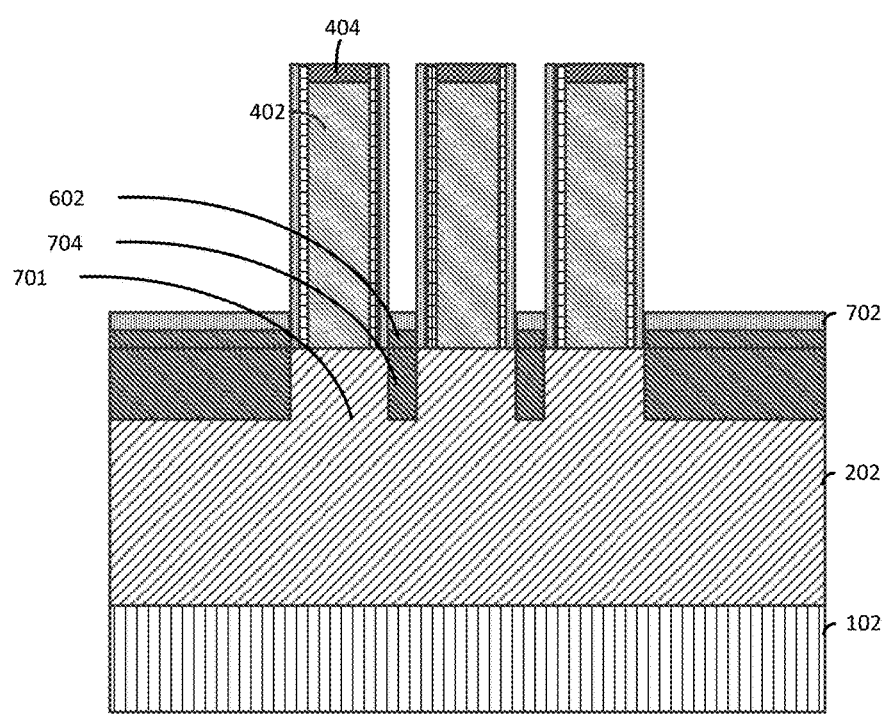
FIG. 7A illustrates a cut-away view along the line C-C (of FIG. 7C) following an annealing process that drives Ge atoms into SiGe source drain area with Ge condensation.
Figure 7B:
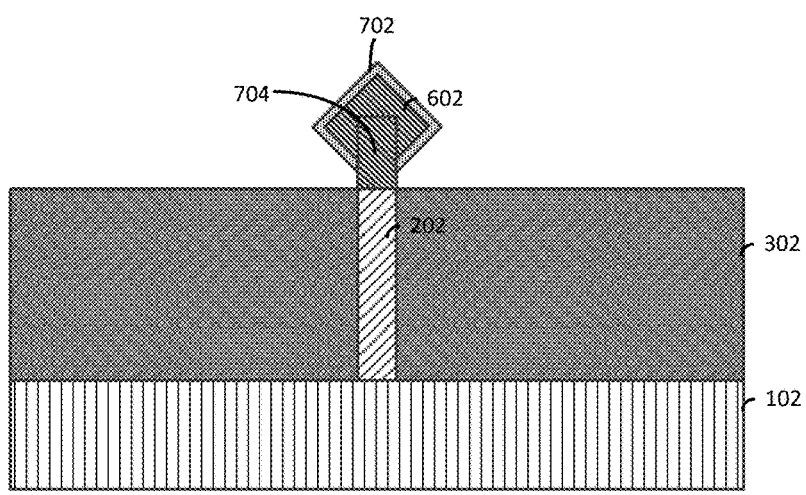
FIG. 7B illustrates a cut-away view along the line A-A (of FIG. 7C) following an annealing process that drives Ge atoms into SiGe source drain area with Ge condensation.

FIG. 7A illustrates a cut-away view along the line C-C (of FIG. 7C), and FIG. 7B illustrates a cut-away view along the line A-A (of FIG. 7C) following an annealing process that drives Ge atoms into the fin 202 to increase the concentration of Ge in the fin 202 in the region 704. In this regard, when the fin 202 is formed from SiGe, the condensation of Ge from the source/drain region into the regions 704 of the fin 202 increases the concentration of Ge in the SiGe fin 202 and increases the compressive strain on the channel regions 701. The condensation of the Ge atoms from the source/drain region 602 into the fin 202 results in an oxide region 702 formed on the surface of the source/drain region 602.

Figure 7C:
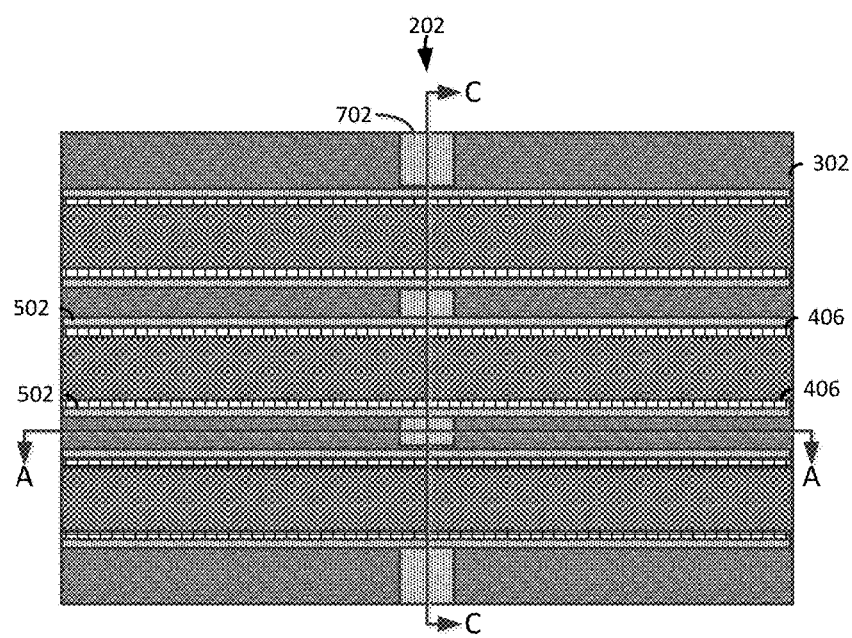
FIG. 7C illustrates a top view following the formation of the oxide region on the source/drain region.

FIG. 7C illustrates a top view following the formation of the oxide region 702 on the source/drain region 602. The source/drain regions 602 have higher Ge content compared with the channel region, for example $Si_{0.4}Ge_{0.6}$ in the source/drain regions and $Si_{0.8}Ge_{0.2}$ in the channel region.

Figure 8A:
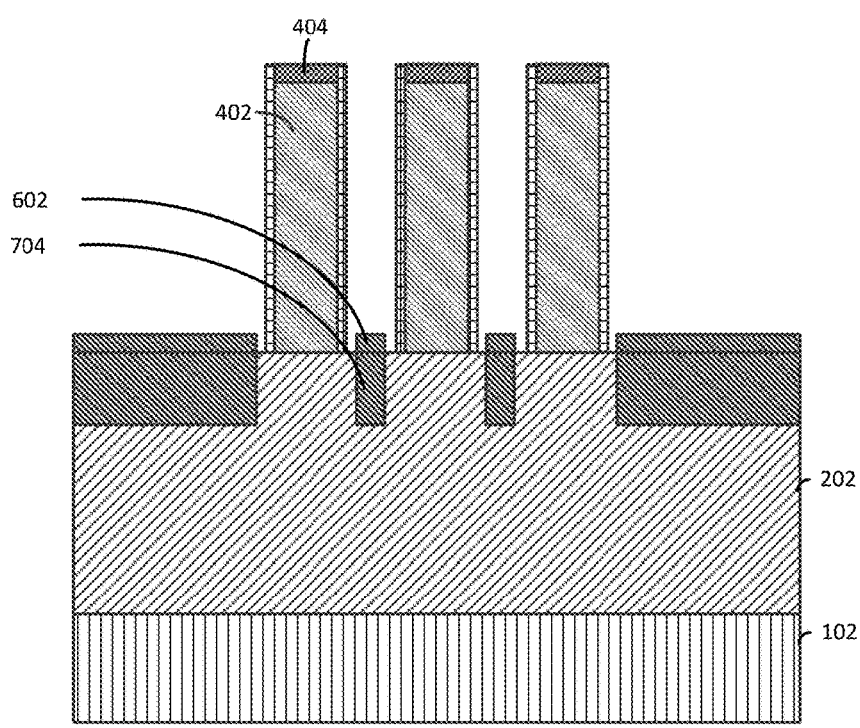
FIG. 8A illustrates a cut-away view along the line C-C (of FIG. 8C) following an etching process that selectively removes the sacrificial spacer and the oxide region (of FIG. 7A) to expose the spacers and the source/drain region.
Figure 8B:
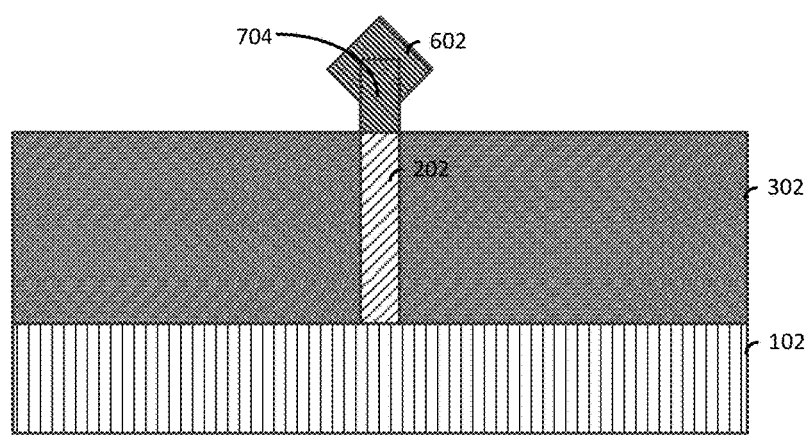
FIG. 8B illustrates a cut-away view along the line A-A (of FIG. 8C)) following an etching process that selectively removes the sacrificial spacer and the oxide region (of FIG. 7A) to expose the spacers and the source/drain region.
Figure 8C:
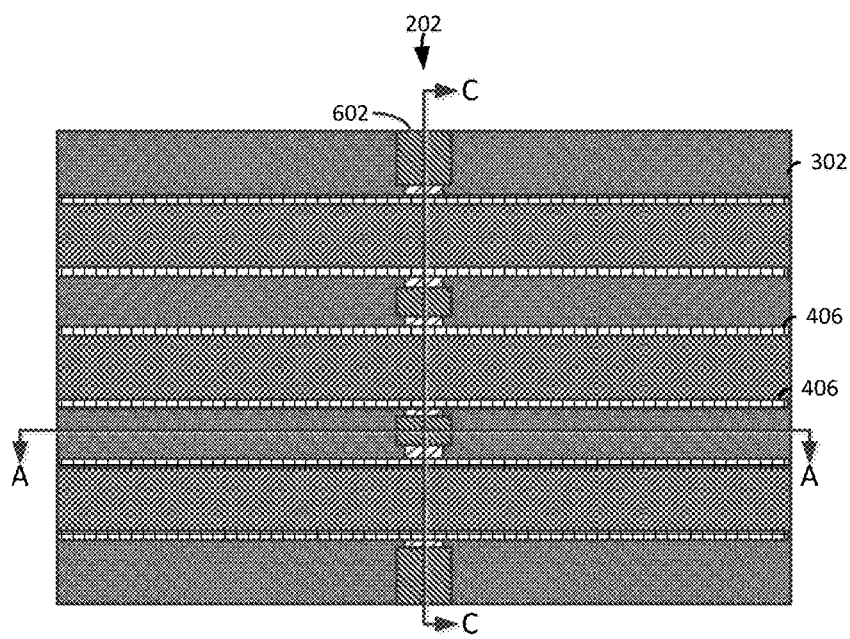
FIG. 8C illustrates a top view following the removal of the sacrificial spacer and the oxide regions.

FIG. 8A illustrates a cut-away view along the line C-C (of FIG. 8C) and FIG. 8B illustrates a cut-away view along the line A-A (of FIG. 8C) following an etching process that selectively removes the sacrificial spacer 502 and the oxide region 702 (of FIG. 7A) to expose the spacers 406 and the source/drain region 602. FIG. 8C illustrates a top view following the removal of the sacrificial spacer 502 and the oxide regions 702.

Figure 9A:
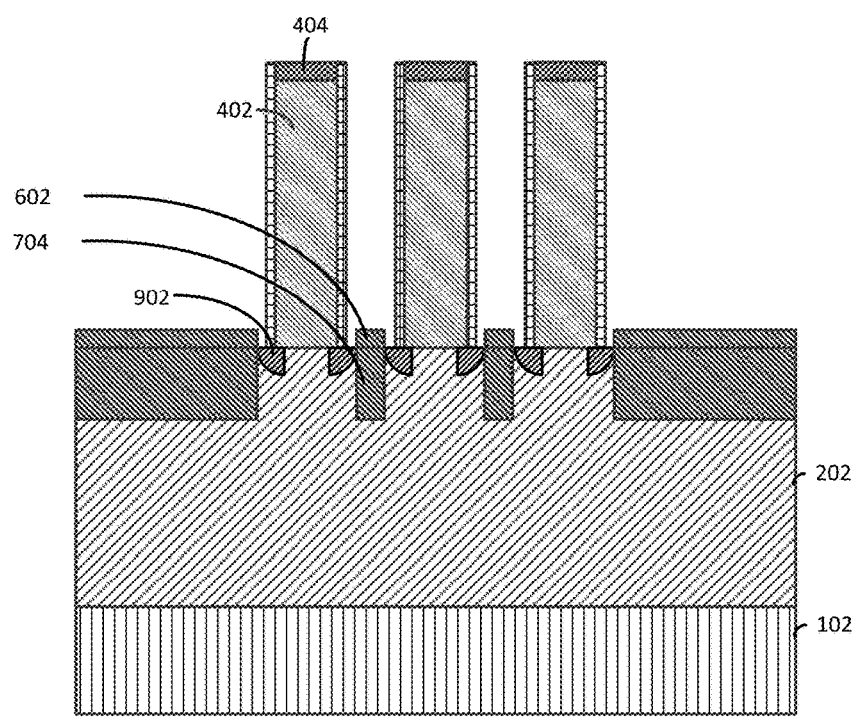
FIG. 9A illustrates a cut-away view along the line C-C (of FIG. 9B) following the formation of source/drain extension regions in the fin that are arranged below the sacrificial gate and the spacer.
Figure 9B:
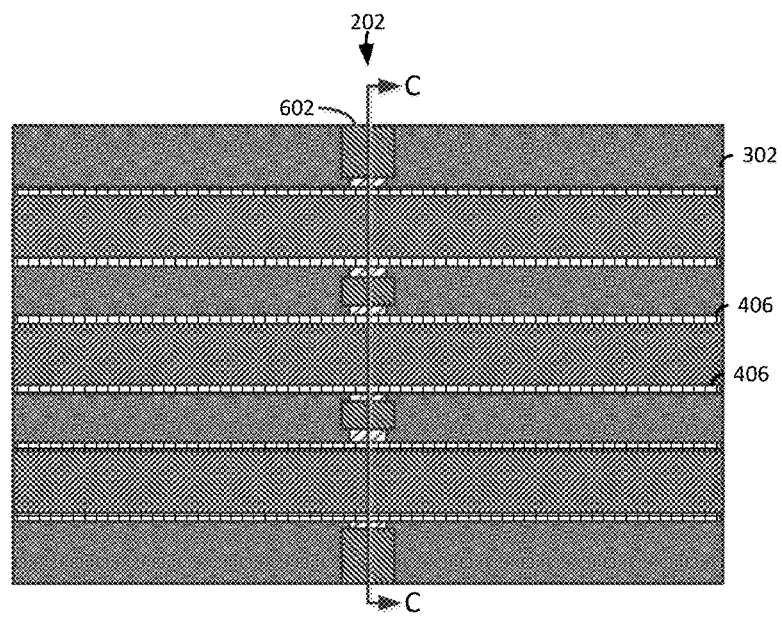
FIG. 9B illustrates a top view following the formation of the source/drain extension regions.

FIG. 9A illustrates a cut-away view along the line C-C (of FIG. 9B) following the formation of source/drain extension regions 902 in the fin 202 that are arranged below the sacrificial gate 404 and the spacer 406. The source/drain extension regions 902 can be formed by, for example a plasma doping and laser annealing process. FIG. 9B illustrates a top view following the formation of the source/drain extension regions 902.

The source/drain regions 602 are arranged such that the source/drain regions 602 do not contact the spacer 406. This provides a gap between the source/drain region 602 and the spacer 406 when the sacrificial spacers 502 are removed. The gap exposes the fin 202, and provides for implanting dopants into the fin 202 when forming the source/drain extension regions 902.

Figure 10A:
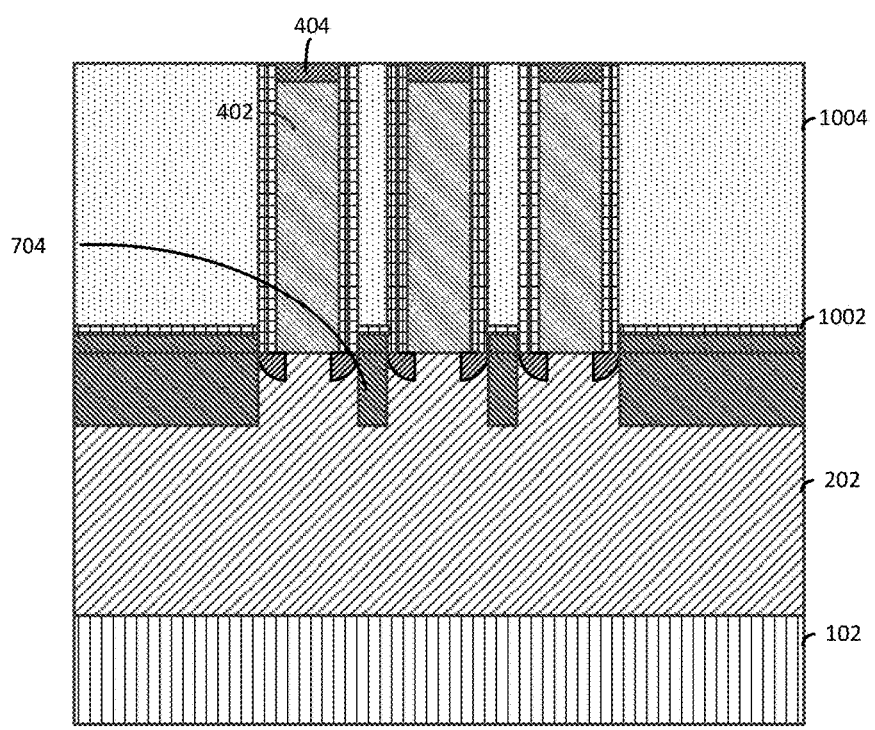
FIG. 10A illustrates a cut-away view along the line C-C (of FIG. 10B) following the formation of a liner layer over the source/drain regions and along sidewalls of the spacers.
Figure 10B:
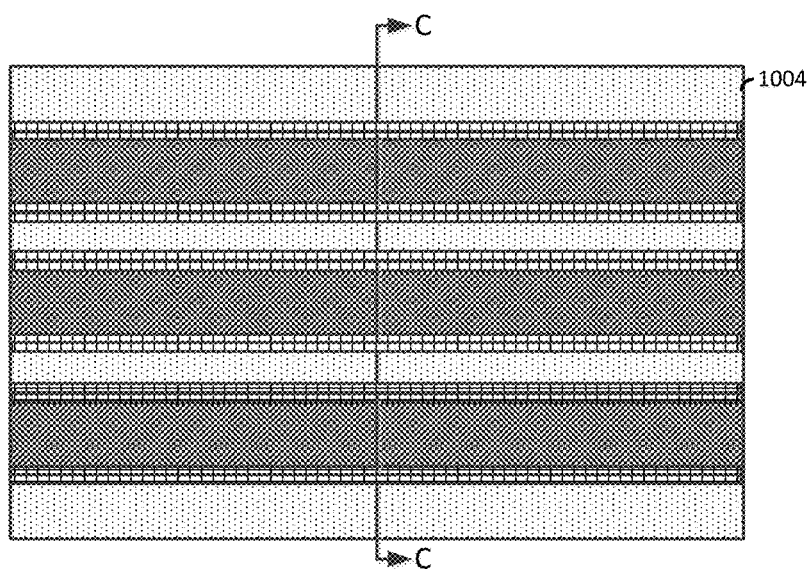
FIG. 10B illustrates a top view following the formation of the inter-level dielectric layer.

FIG. 10A illustrates a cut-away view along the line C-C (of FIG. 10B) following the formation of a liner layer 1002 over the source/drain regions 602 and along sidewalls of the spacers 406. Following the formation of the liner layer 1002, an inter-level dielectric layer 1004 is formed over the liner layer 1002. FIG. 10B illustrates a top view following the formation of the inter-level dielectric layer 1004.

The inter-level dielectric layer 1004 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1004 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1004, a planarization process such as, for example, chemical mechanical polishing is performed.

Figure 11A:
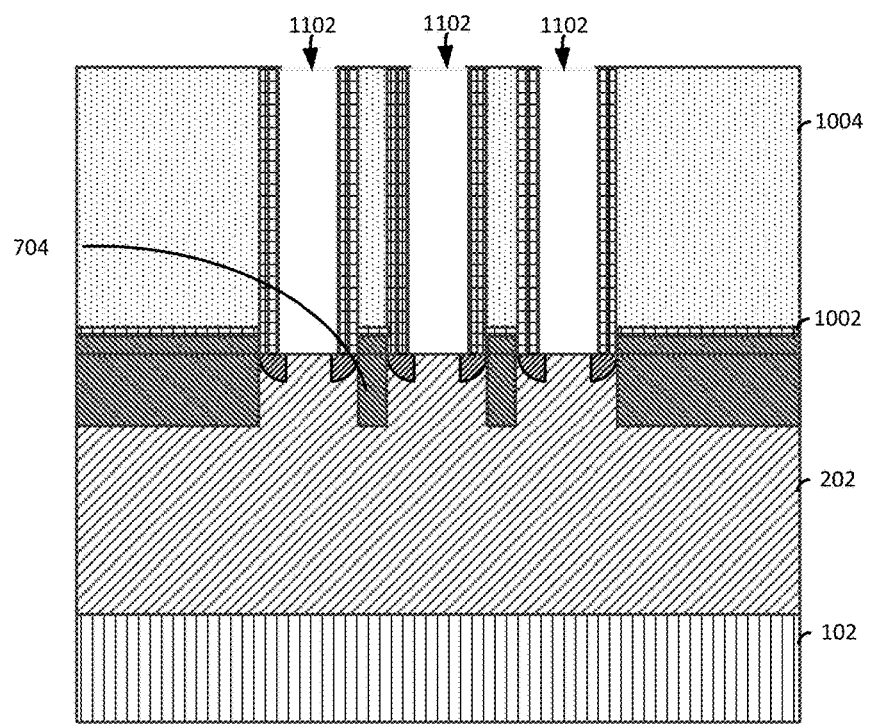
FIG. 11A illustrates a cut-away view along the line C-C (of FIG. 11B) following the removal of the sacrificial gates.
Figure 11B:
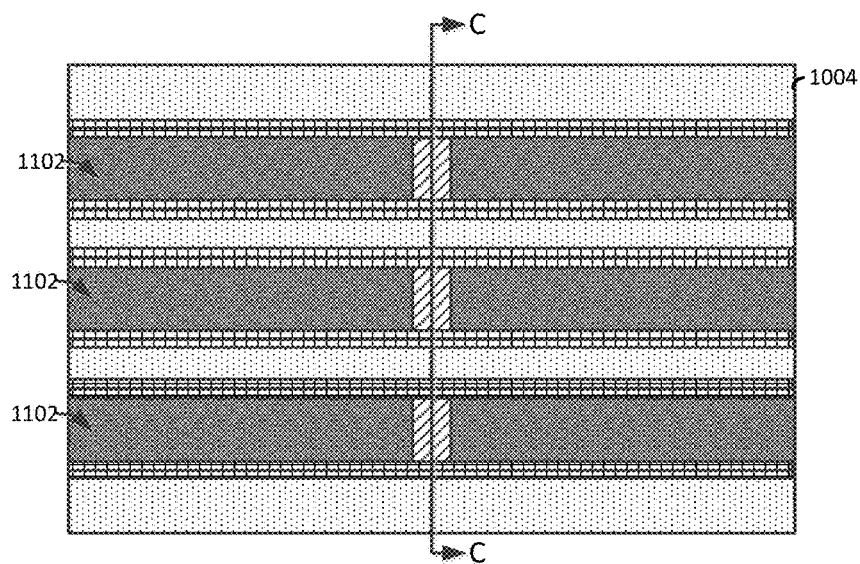
FIG. 11B illustrates a top view following the removal of the sacrificial gates.

FIG. 11A illustrates a cut-away view along the line C-C (of FIG. 11B) following the removal of the sacrificial gates 402. FIG. 11B illustrates a top view following the removal of the sacrificial gates 402. The removal of the sacrificial gates 402 (of FIG. 10A) forms cavities 1102 that expose the channel regions of the fins 202. The sacrificial gates 402 can be removed by performing a dry etch process, for example, RIE, followed by a wet etch process. The wet etch process is selective to (will not substantially etch) the spacers 406 and the inter-level dielectric material 1004. The chemical etch process can include, but is not limited to, hot ammonia or tetramethylammonium hydroxide (TMAH).

Figure 12A:
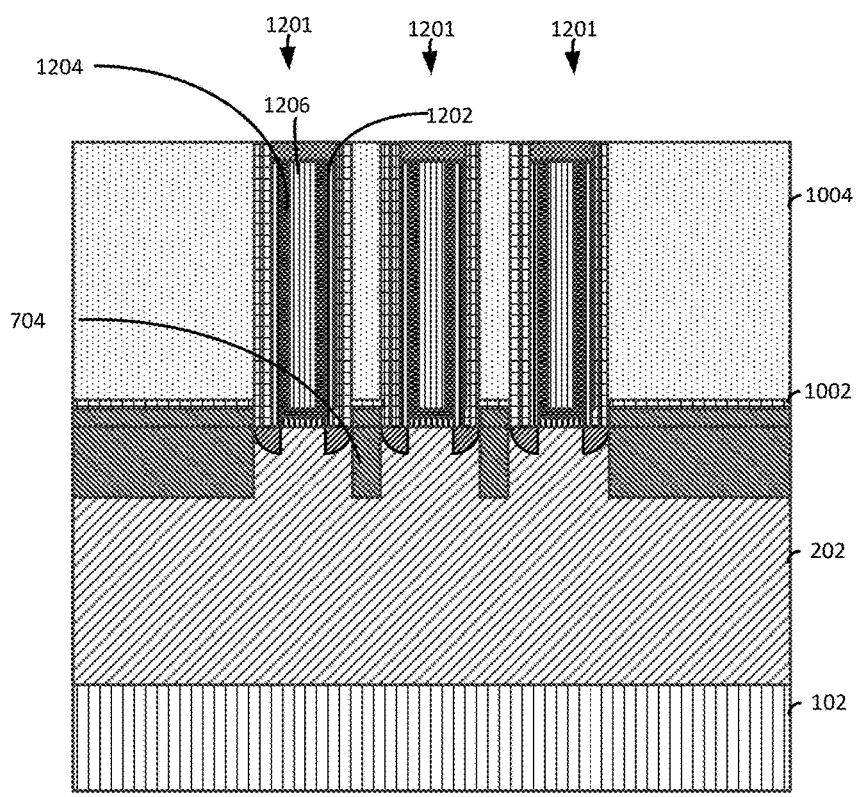
FIG. 12A illustrates a cut-away view along the line C-C (of FIG. 12B) following the formation of a replacement metal gate stack (gate stack).
Figure 12B:
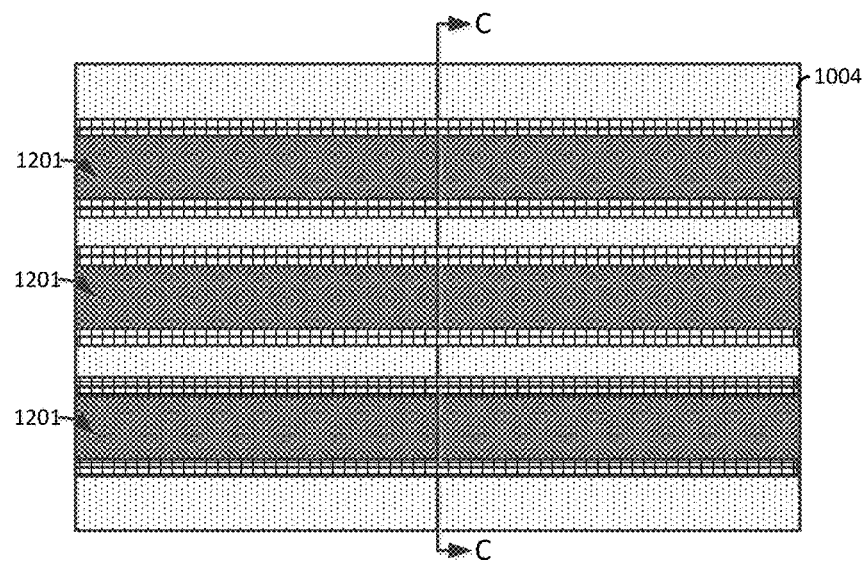
FIG. 12B illustrates a top view following the formation of a replacement metal gate stack (gate stack).

FIG. 12A illustrates a cut-away view along the line C-C (of FIG. 12B) and FIG. 12B illustrates a top view following the formation of a replacement metal gate stack (gate stack) 1201. The gate stack 1201 include high-k metal gates formed, for example, by filling the cavity 1102 (of FIG. 11A) with one or more gate dielectric 1202 materials, one or more workfunction metals 1204, and one or more metal gate conductor 1206 materials. The gate dielectric 1202 material (s) can be a dielectric material having a dielectric constant greater than 3.9, 7.0, or 10.0. Non-limiting examples of suitable materials for the dielectric 1202 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 1202 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 1204 can be disposed over the gate dielectric 1202 material. The type of work function metal(s) 1204 depends on the type of transistor and can differ between the nFET and pFET devices. Non-limiting examples of suitable work function metals 1204 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 1206 material(s) is deposited over the gate dielectric 1202 materials and work function metal(s) 1204 to form the gate stack 1201. Non-limiting examples of suitable conductive metals include aluminum (Al), platinum (Pt), gold (Au), tungsten (W), titanium (Ti), or any combination thereof. The gate conductor 1206 material(s) can be deposited by a suitable deposition process, for example, CVD, PECVD, PVD, plating, thermal or e-beam evaporation, and sputtering.

Following the deposition of the gate dielectric 1202 materials, the work function metal(s) 1204, and the gate conductor 1206 material(s), planarization process, for example, chemical mechanical planarization (CMP), is performed to remove the overburden of the deposited gate materials and form the gate stack 1201.

Figure 13A:
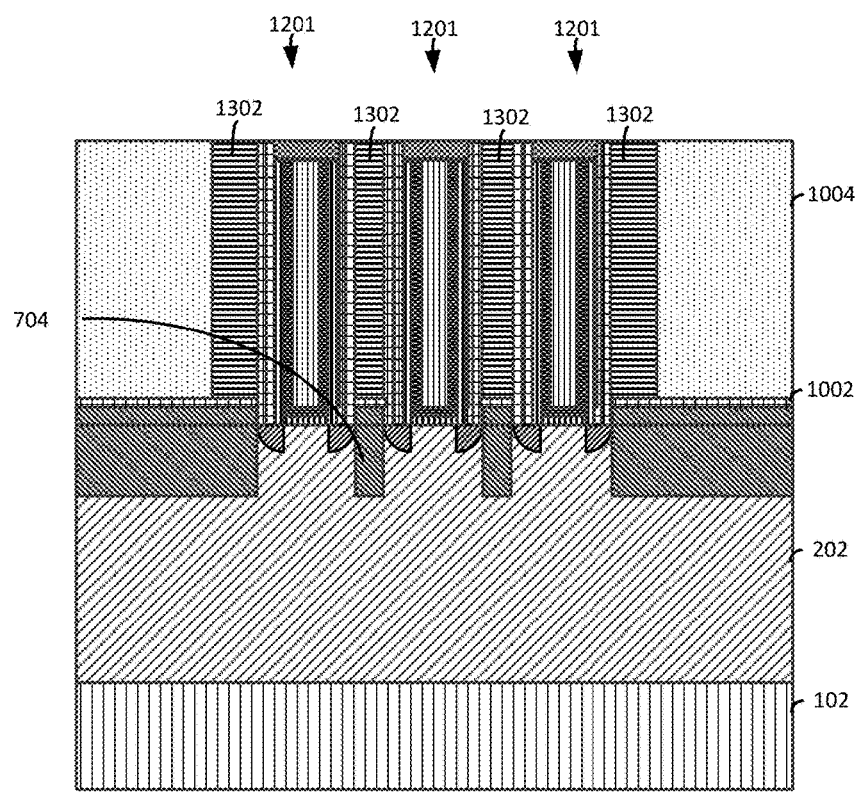
FIG. 13A illustrates a cut-away view along the line C-C (of FIG. 13C) of the resultant structure following an etching process that removes portions of the inter-level dielectric layer to form cavities that are filled with a conductive contact material.
Figure 13B:
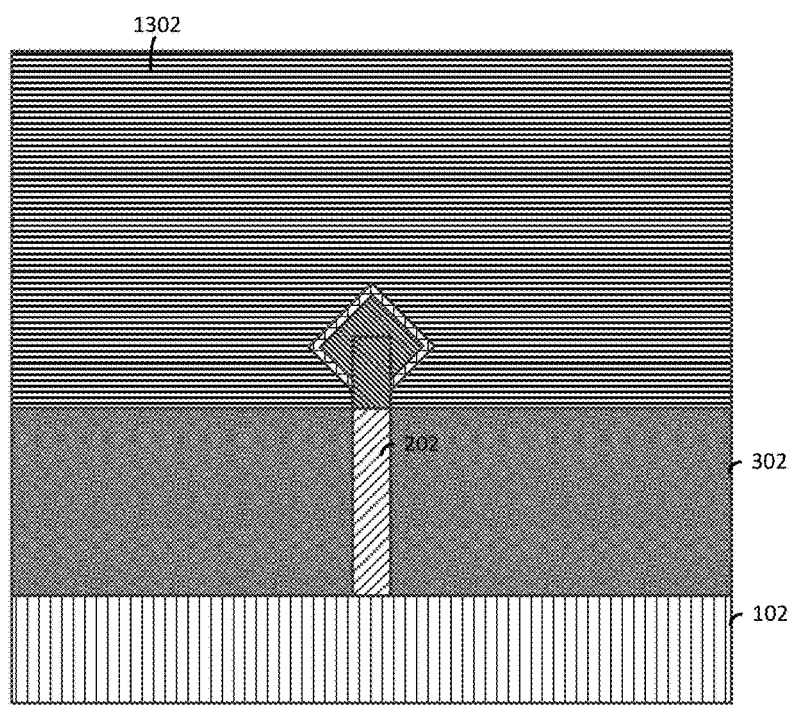
FIG. 13B illustrates a cut-away view along the line A-A (of FIG. 13C) of the resultant structure following an etching process that removes portions of the inter-level dielectric layer to form cavities that are filled with a conductive contact material.
Figure 13C:
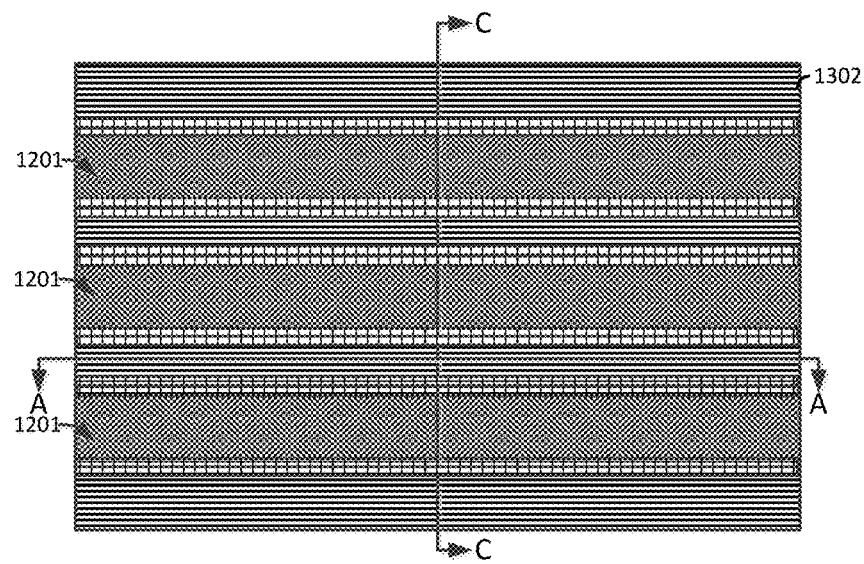

FIG. 13A illustrates a cut-away view along the line C-C (of FIG. 13C), FIG. 13B illustrates a cut-away view along the line A-A (of FIG. 13C), and FIG. 13C illustrates a top view of the resultant structure following an etching process that removes portions of the inter-level dielectric layer 1004 to form cavities that are filled with a conductive contact material 1302. In some embodiments, a liner layer (not shown) to form conductive contacts (not shown).

The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

The methods and resultant devices described herein provide for forming a finFET device having a fin with a strained channel region. The strain is maintained on the channel region of the fin by avoiding recessing the fin prior to forming the source/drain regions.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a strained fin on a substrate;
    forming a sacrificial gate on a channel region of the fin;
    forming a first spacer adjacent to a sidewall of the fin;
    forming a second spacer adjacent to the first spacer;
    growing a source/drain region on an exposed portion of the fin;
    annealing to drive atoms from the source/drain region into the fin and form an oxide layer on the source/drain region;
    removing the second spacer and the oxide layer;

forming an insulator layer over the source/drain region;
removing the sacrificial gate to expose the channel region of the fin; and
forming a gate stack over the channel region of the fin.

2. The method of claim 1, wherein the substrate includes silicon.

3. The method of claim 1, wherein the strained fin includes SiGe.

4. The method of claim 1, wherein the source/drain region includes Ge.

5. The method of claim 1, wherein the atoms are Ge atoms.

6. The method of claim 1, wherein the annealing increases a concentration of Ge atoms in the fin.

7. The method of claim 1, wherein the first spacer includes a nitride material and the second spacer includes an oxide material.

8. The method of claim 1, wherein the strained fin is compressively strained.

9. The method of claim 1, further comprising:
forming a source/drain extension region by implanting dopants in the after removing the second spacer;
removing portions of the insulator layer to expose the source/drain region; and
forming a conductive contact over the source/drain region.

10. A method for forming a semiconductor device, the method comprising:
forming a strained semiconductor layer on a substrate;
removing portions of the strained semiconductor layer to form a fin on the substrate;
depositing an insulator layer on the substrate;
forming a sacrificial gate on a channel region of the fin;
forming a first spacer adjacent to a sidewall of the fin;
forming a second spacer adjacent to the first spacer;
growing a source/drain region on an exposed portion of the fin;
annealing to drive atoms from the source/drain region into the fin and form an oxide layer on the source/drain region;
removing the second spacer and the oxide layer;
forming an insulator layer over the source/drain region;
removing the sacrificial gate to expose the channel region of the fin; and
forming a gate stack over the channel region of the fin.

11. The method of claim 10, wherein the substrate includes silicon.

12. The method of claim 10, wherein the strained semiconductor layer includes SiGe.

13. The method of claim 10, wherein the source/drain region includes Ge.

14. The method of claim 10, wherein the atoms are Ge atoms.

15. The method of claim 10, wherein the annealing increases a concentration of Ge atoms in the fin.

16. The method of claim 10, wherein the first spacer includes a nitride material and the second spacer includes an oxide material.

17. The method of claim 10, wherein the strained semiconductor layer is compressively strained.

18. The method of claim 10, further comprising:
forming a source/drain extension region by implanting dopants in the after removing the second spacer;
removing portions of the insulator layer to expose the source/drain region; and
forming a conductive contact over the source/drain region.

* * * * *